(12) United States Patent
Luiten et al.

(10) Patent No.: US 10,865,975 B2
(45) Date of Patent: Dec. 15, 2020

(54) HEAT SINK LIGHTING DEVICE AND METHOD FOR MANUFACTURING A HEAT SINK

(71) Applicant: SIGNIFY HOLDING B.V., Eindhoven (NL)

(72) Inventors: Gwendolin Anita Luiten, Eindhoven (NL); Frank De Leeuw, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 168 days.

(21) Appl. No.: 15/747,144

(22) PCT Filed: Jul. 18, 2016

(86) PCT No.: PCT/EP2016/067049
§ 371 (c)(1),
(2) Date: Jan. 23, 2018

(87) PCT Pub. No.: WO2017/021130
PCT Pub. Date: Feb. 9, 2017

(65) Prior Publication Data
US 2018/0209635 A1    Jul. 26, 2018

(30) Foreign Application Priority Data

Aug. 4, 2015    (EP) ..................... 15179642

(51) Int. Cl.
*F21V 29/71*    (2015.01)
*F21V 29/76*    (2015.01)
(Continued)

(52) U.S. Cl.
CPC .......... *F21V 29/713* (2015.01); *F21V 29/763* (2015.01); *F28F 3/06* (2013.01);
(Continued)

(58) Field of Classification Search
CPC ............ H01L 23/3672; H05K 7/20148; H05K 7/20154; F21V 29/713; F21V 29/763;
(Continued)

(56) References Cited

U.S. PATENT DOCUMENTS 6,301,779 B1 * 10/2001 Azar ....................... B23P 15/26
165/80.3
6,315,032 B1    11/2001 Lee et al.
(Continued)

FOREIGN PATENT DOCUMENTS

DE    102009007612 A1    8/2009
EP    0779658 A2    6/1997
(Continued)

*Primary Examiner* — Joel M Attey
(74) *Attorney, Agent, or Firm* — Daniel J. Piotrowski

(57) ABSTRACT

A finned heat sink (1) comprising a stack of N finned heat sink plates (3). The N finned heat sink plates comprise a top plate (3a) on top of a bottom plate (3b) and optionally at least one sandwiched plate (3c). The bottom plate (3b), the top plate (3a) and the sandwiched plate (3c) comprise a heat dissipating fin (9) and an opening (7). The fins (9) are bent out of plane of the plates (3). The fin (9) of the bottom plate (3b) and the sandwiched plate (3c) extend through the opening (7a) in the top plate (3a) in the same direction as the fin (9a) of the top plate (3a).

13 Claims, 8 Drawing Sheets

(51) Int. Cl.
  *F28F 3/08*    (2006.01)
  *F28F 3/06*    (2006.01)
  *F21Y 101/00*   (2016.01)
  *F28D 21/00*   (2006.01)
  *H05K 7/20*    (2006.01)
  *H01L 23/367*   (2006.01)
  *F21Y 115/10*   (2016.01)

(52) U.S. Cl.
  CPC .............. *F28F 3/08* (2013.01); *F21Y 2101/00* (2013.01); *F21Y 2115/10* (2016.08); *F28D 2021/0029* (2013.01); *F28F 2215/00* (2013.01); *F28F 2255/08* (2013.01); *F28F 2275/04* (2013.01); *F28F 2275/12* (2013.01); *H01L 23/3672* (2013.01); *H05K 7/20154* (2013.01)

(58) Field of Classification Search
  CPC .. F28F 3/06; F28F 3/08; F28F 2275/12; F28F 2275/04; F28F 2255/08; F21Y 2115/10; F21Y 2101/00; F28D 2021/0029

USPC ........................................................ 165/80.3
  See application file for complete search history.

(56)      References Cited

U.S. PATENT DOCUMENTS

| | | |
|---|---|---|
| 6,446,709 B1 | 9/2002 | Huang |
| 2013/0075073 A1* | 3/2013 | Wang .................. H01L 23/3672 165/185 |

FOREIGN PATENT DOCUMENTS

| | | |
|---|---|---|
| EP | 1104015 A2 | 5/2001 |
| EP | 2463903 A1 | 6/2012 |
| JP | 2001284505 A | 10/2001 |
| JP | 2002329820 A | 11/2002 |
| JP | 2008153493 A | 7/2008 |
| JP | 2009026784 A | 2/2009 |
| JP | 2009099740 A | 5/2009 |
| JP | 2013162036 A | 8/2013 |
| JP | 20130162036 A | 8/2013 |

\* cited by examiner

HEAT SINK LIGHTING DEVICE AND METHOD FOR MANUFACTURING A HEAT SINK

CROSS-REFERENCE TO PRIOR APPLICATIONS

This application is the U.S. National Phase application under 35 U.S.C. § 371 of International Application No. PCT/EP2016/067049, filed on Jul. 18, 2016, which claims the benefit of European Patent Application No. 15179642.2, filed on Aug. 4, 2015. These applications are hereby incorporated by reference herein.

FIELD OF THE INVENTION

The invention relates to a finned heat sink comprising a fin cut out from a heat sink plate and bent out of plane of said plate. The invention further relates to a lighting device comprising such a heat sink and a method for manufacturing such a heat sink.

BACKGROUND OF THE INVENTION

Finned heat sinks are used in cooling applications to enlarge the cooling surface. Finned heat sinks often are manufactured by forging, casting, die-casting, or extrusion. These manufacturing methods are bounded by a minimum fin thickness to allow for material flow and maximum base dimensions for size of the press and the mold. In addition, enhancing "flowability" of heatsink material is usually at the cost of thermal conductivity, hence die-cast, extrusion and forging alloys typically have lower thermal conductivity. It is advantageous to have closely packed high and thin fins to have a large cooling surface at a small volume and small weight, but this is hard to achieve in forging, casting, die-casting or extrusion, and hence leads to increased cost. One solution to this problem is to cut fins out of flat plates, and bond the butt end of the plate to a bottom plate, for instance by compression, soldering or brazing. The butt end joint of the flat plate fin to the heat sink base is both mechanically and thermally a weak point. Both heat and force have to pass through the small contact area provided by the butt joint between the fin and the bottom plate. Heat flow is severely compromised by less-than-ideal contact in the small area. To attain good thermal contact requires additional expensive processing, and hence costs are added to ensure said good thermal contact. Mechanical failure of the joint, for instance by handling, compromises the thermal function Thinner fins have a smaller butt area and are more fragile. Hence, in addition the manufacturing of good quality butt joints is achieved at a cost and for a certain minimum fin thickness.

Alternatively, it is also known that finned surfaces can be made by cutting and bending fins out of a flat plate. Such a heat sink is described in the opening paragraph and is, for example, known from EP0779658A2. This avoids the disadvantage of needing material flow to make fins in situ. However, this known heat sink involves the disadvantages that its thermal cooling functioning is relatively low and that it can only be suitably applied for low aspect ratio finned surfaces where the fin height is less than the fin distance.

SUMMARY OF THE INVENTION

It is an object of the invention to provide a heat sink of the type as described in the opening paragraph in which at least one of the disadvantages is counteracted or obviated. Thereto a finned heat sink is provided comprising a stack of N heat sink plates comprising a bottom plate and a top plate, each plate comprising a heat dissipating fin being bent over a first edge part out of plane of the heat sink plate and a base part with an opening, wherein the base part of the top plate is on top of the base part of the bottom plate and wherein the fin of the bottom plate is bent and extends through the opening in the top plate and at a same side of the top plate, the finned heat sink further comprising a heatsink base on which the heat sink plates are mounted, wherein each heat sink plate has a thickness T and the heatsink base comprises a profile step with a profile size Ps according to the relation $Ps = O/N$, wherein O is the distance between two adjacent first edges in the base part of the top heat sink plate transverse to the first edge, and Ps is measured along the plane P of the base part of the top heat sink plate in a direction transverse to the first edge, each step having a height H essentially equal to said thickness T. By the inventive heat sink the issue of contradictive parameters required for good thermal functioning is solved of the known stamped and bent plate heat sinks, i.e. that the fin height must be large for thermal functioning but the fin height must be small for dense packing of fins. The invention is based on the understanding that in many cases the thermal functioning of the fin is limited by its area and not by its internal heat conduction, hence increasing the conductive resistance by introducing interface resistances between the touching interfaces of the stacked plates will not be a problem. The weak butt joint is eliminated by bending the fin out of the base plate, thus avoiding the inherent mechanical and thermal weakness. In addition the contact area between base parts is large compared to the area of the butt joint, hence heat transport from base part into the fin via thermal conduction is much higher. By the heat sink base having a stepped profile fulfilling the conditions listed in the claim, the presence of poorly thermal conductive (air) pockets between the heatsink base and the bottom surfaces of the stacked plates is reduced and the through plane resistance Rth is reduced. Furthermore, with the inventive heat sink the contradiction is solved that the fin must be thick in order to have a robust contact area for good heat transport from base part into the fin via thermal conduction and that the fin must be thin in order to have good thermal functioning for favorable low weight and volume. For the fins that extend at the same side of the top plate it is quite convenient that said fins are arranged more or less or exactly in parallel and extend in essentially the same direction. Alternatively it is also possible to have the said arrangement, for example with one middle plate and two or more outer plates, with fins extending to both directions. The finned heat sink according to the invention is applicable for (passive) cooling of electronic products in general or more specifically for cooling of electronic products, or even more specifically for lighting devices such as lamps, luminaires, and beamers.

An embodiment of the finned heat sink is characterized in that for each finned heat sink plate the heat dissipation fin has a perimeter comprising a first edge part, said fin being cut out from the base part over said perimeter except for said first edge part. The combined arrangement of at least two heat sink plates enables in a relatively simple and easy manner the manufacture of finned heat sinks wherein the fin height is less than the fin distance. Each heat sink plate can comprise more than one fin and/or more than one opening in its base part, for example two, three, four, five, six, or up to sixty fins and one opening or a number of openings. Alternatively, the number of openings is equal to the number of fins per heats sink plate, for example said number of fins/opening per heat sink plate is one, two, three, four, five, six, eight, ten, twelve, or up to thousand.

N stands for the number of finned heat sink plates, when N is three or larger, the finned heat sink comprises N−2 sandwiched plates located in between the top and bottom plate. The fin, or fins, of each of the sandwiched plates extends through a respective opening of the top plate. By the number of heat sink plates the ratio between fin height and fin density can be easily controlled, and hence the cooling capacity can be easily affected. A conventional number for N is in the range of 2 to 15, preferably N is in the range of 3 to 8 as then the spacing between the fins and the number of boundaries between the base parts of the stacked plates through which heat transfer has to take place is a well-balanced ratio. The thermal resistance between the outer surfaces of the outer plates, for example between the top of the top plate and the bottom of the bottom plate, is also referred to as the through-plane resistance Rth. A high trough plane Rth is often mainly built up by poorly thermally conducting air layers and air pockets between the base parts of the stacked plates through which heat transfer has to take place. Often, the finned heat sink has fins which each have a surface area essentially of a size equal to a size of the opening bordered by the first edge of said respective fin. As the fin is punched out of the base part of the plate, and subsequently bent out of plane of said base part both the fin and the opening are obtained simultaneously with both the fin and the opening having essentially the same size. Alternatively it is also possible to punch out an opening that is slightly larger than the bent fin (the material between the punched fin perimeter and the punched opening perimeter becomes waste), this enables a somewhat easier bending out of plane processing and enabling easier stacking of the fin plates. Likewise it is also possible to omit the long plate edge on one side of the fin plate transverse to the first edge in order to enable sideways assembly as opposed to vertical stacking. Alternatively, it is possible to punch/cut out a plurality of fins followed by bending the fins out of plane of the base part, and wherein the punched and bent fins together have the same area of the one opening which is formed by bending said plurality of fins. Alternatively it is also possible to cut and bend a plurality of fins in the longitudinal direction to edge 1. If stacked on top of each other, the fin assembly is the shape commonly referred to as a crosscut fin. Crosscut fins are known to be advantageous in certain conditions, for instance because they are more accessible to air flow. Alternatively it is then also possible to place multiple base plates adjacent to one another and multiple top plates adjacent to one another but overlapping the first layer of finned plates. This "overlapping tiling" of heatsink plates enables formation of very large heatsink areas from multiple smaller units, without encountering the limitations in the press tonnage or mold dimensions.

There are a number of ways to affect or to control the cooling properties of the finned heat sink, for example fin height, fin thickness, fin distance, number of plates in the stack, material and surface treatment, including no surface treatment. For example, the material of the heat sink might be varied, which generally is made of metal, for example copper or aluminum, but alternatively heat resistant and thermal conductive plastics or combinations of different materials are possible, for example graphite laminated onto aluminum or copper foil. Another example in the way to affect the cooling properties of the finned heat sink is by adjusting the distance or the spacing between adjacent fins, or that the angle by which the fins are bent out of plane varies in a direction transverse to the first edge, for example in that the outer fins are bent less out of plane than central fins, i.e. that outer fins are at a more acute angle with the plane than the central fins that, for example, extend essentially perpendicular to said plane. It is also possible that the fins are spaced apart approximately equidistantly in a direction transverse to the first edge. In particular the fins of the heat sink plates are spaced apart by a spacing S according to the relation $S=O/N$, wherein O is the distance between two adjacent first edges in the base part of the top heat sink plate transverse to the first edge, and S is measured along the plane of the base part of the top heat sink plate in a direction transverse to the first edge.

Alternatively or additionally the stepped pocket in the stack of heat sink plates can be filled with a suitably soft (thermal) interface material for instance a thermal gap filler with ceramic particles. Poorly thermal conducting air layers between the base parts of the heat sink plates also contribute to unwanted high thermal resistance. Additionally and alternatively to the stepped insert or gap filler material in the pockets formed by the stacked (openings in the) plates, the heat sink plates of the finned heat sink abut each other with their base parts and preferably abut each other under a permanent compressive force. The heat sink plates of the stack can be mutually mechanically joined with metal fasteners, for example with screws, rivets, or with resilient clamps exerting a compressive force, this will further lower the through plane resistance of the stack. Yet further alternatively or additionally the heatsink plates of the stack can be directly mutually bonded, for instance by direct metallic bonding, for instance through nano-reactive foil or direct copper bonding or by use of a metal or non-metal interface layer, for example soldered or brazed, or using thermal grease or similar interface materials. Table 1 shows the effect of some design variations of a bottom plate with or without a stepped profile and with touching surfaces of heat sink plates with or without a thermal interface, on the thermal resistance between the bottom of the heatsink base and the ambient air (Rth) as calculated by computer simulations.

TABLE 1

Calculated Rth for various heat sinks embodiments.

| Embodiment | base | interface | Rth in K/W |
| --- | --- | --- | --- |
| 1 | profiled | bonded | 0.4 |
| 2 | flat | bonded | 0.5 |
| 3 | profiled | dry | 0.5 |
| 4 | flat | dry | 0.6 |

In an embodiment of the finned heat sink the opening has an open side. Thereto one longitudinal side strip of the base part of the heat sink plate is removed. Thus, openings with an open side are obtained via which sideways assembly and stacking of multiple heat sink plates is enabled when of all openings in one heat sink plate the longitudinal strip is removed at the same side.

In an embodiment of the finned heat sink the heat sink plate comprises a plurality of parallel rows of fins and openings, the parallel rows of openings being separated by a respective longitudinal central strip. By positioning or tiling adjoining heat sink plates in a row or matrix arrangement, mutually abutting each other, and by stacking a further heat sink plate on top of said arranged heat sink plates so that it partially overlaps at least two of said arranged heats ink plates, a combined heat sink can be created by a number of elementary heat sink plates, said combined heat sink plate has a larger size than the size of an elementary heat sink plate. As can be easily envisaged, more heat sink plates can be used in this way to create an even larger combined heat sink plate.

The invention further relates to a lighting device comprising a finned heat sink according to the invention. Lighting devices which suitably can comprise the heat sink according to the invention are lamps, for example a LED lamp, for example a LED retrofit compact halogen lamp. Alternatively, the lighting device can be a luminaire, for example a LED luminaire, high power (LED) luminaires, or luminaires for sports and area lighting. Still further alternatively, the lighting device can be a projector, such as a beamer comprising a light source such as a laser or a plurality of LEDs. It is well-known that heat dissipation is important for devices comprising high power LED lamps, the LED die or the chip on board (COB) LED can then suitably be mounted on the bottom plate of the finned heat sink according to the invention, i.e. mounted on a surface opposite the surface of the bottom plate facing away from the fins. Alternatively additional fins, placed at appropriate distance can be placed around the light source at the surface at the side of the light source.

The invention further relates to a method of manufacturing a finned heat sink. The method comprising the steps of:
  manufacturing a finned heat sink plate by
    cutting out a heat dissipating fin from a base part of a heat sink plate over a perimeter of the fin except for a first edge part of said perimeter,
    bending said fin over said first edge part out of plane of said base part thus generating an opening in said base part of the heat sink plate,
  arranging two of said finned heat sink plates in a stacked position in an arrangement of a bottom plate and a top plate, such that the fins of the bottom plate and the top plate extend away from the bottom plate, and that the fin of the bottom plate extends through said opening in the top plate. Alternatively it is also possible to have the said arrangement with one middle plate and two or more outer plates with fins extending to both directions. Additionally, fins can be mechanically linked to one another to provide increased mechanical stability of the heatsink.

BRIEF DESCRIPTION OF THE DRAWINGS

The invention will now be further elucidated by means of the schematic drawing, in which the dimensions of some parts might be exaggerated for the sake of clarity. The drawing is intended to show the principle of the invention and is by no means intended to limit the invention to the given embodiments. The number of certain parts, for example fins, openings and stacked heat sink plates, given in the embodiments can be lower or higher. In the drawing:

FIG. 4b shows a cross-sectional view of a third embodiment of the finned heat sink according to the invention with the base of FIG. 4a;

FIG. 6b shows a heat sink comprising two stacked fin plates of FIG. 6a;

FIG. 6c shows the construction of a larger heatsink from overlapping tiling of the heat sink plates of FIG. 6a;

DESCRIPTION OF PREFERRED EMBODIMENTS

Figure 1:
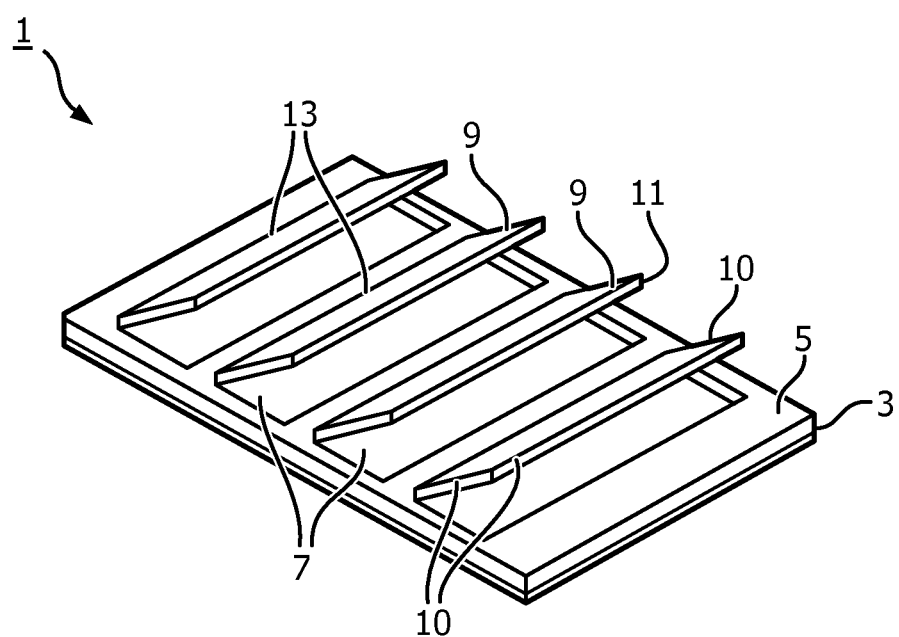
FIG. 1 shows a perspective view of a finned heat sink plate according to the prior art.

FIG. 1 shows a perspective view of a stamped, finned heat sink 1 according to the prior art. The heat sink comprises only one heat sink plate 3 plate, said plate has a base part 5 with four openings 7 and equally sized four fins 9. From each opening one rectangular fins has been punched along three sides 10 of a perimeter 11 of each fin. A first edge 13 of the perimeter remains un-punched and each fin is bend over said first edge out of plane P of the base part to extend at an acute angle to said plane. This known heat sink involves the disadvantages that its thermal cooling functioning is relatively low and that it can only be suitably applied for low aspect ratio finned surfaces where the fin height is less than the fin distance.

Figure 2A:
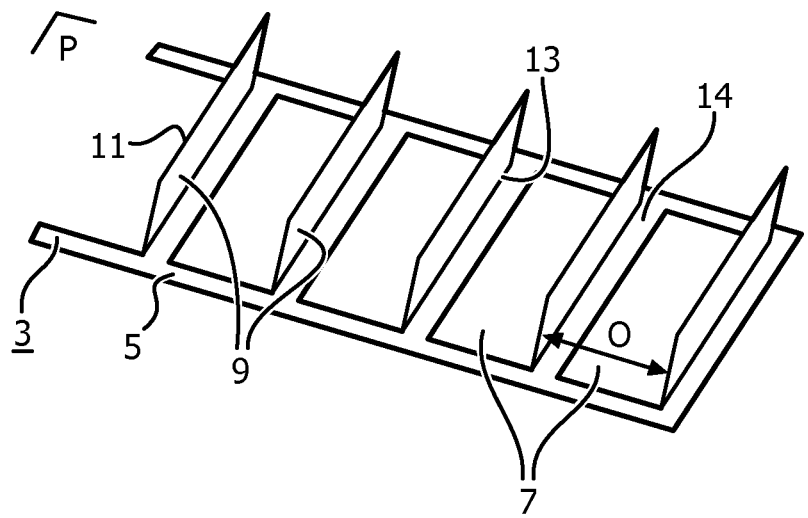
FIG. 2a shows a perspective view of a single heat sink plate to be used in a first embodiment of a finned heat sink according to the invention with stacked heat sink plates as shown in FIG. 2c.

FIG. 2a shows a perspective view of a single heat sink plate 3 used in a first embodiment of a finned heat sink according to the invention. The single heat sink plate shown in FIG. 2a is quite similar to the known finned heat sink, i.e. said plate has a base part 5 with five openings 7 and equally sized five fins 9. From each opening one rectangular fins has been punched along three sides of a perimeter 11 of each fin. A first edge 13 of the perimeter 11 remains un-punched and each fin is bend over said first edge out of plane P of the base part to extend essentially transverse to said plane P. The fins have a size of 130*50 mm and are punched out of an anodized aluminum plate of 150*300 mm of 1 mm thickness, the distance O between two adjacent first edges in the base in the direction perpendicular to said first edges are of the dimension as the fin plus the width of a bridge base part 14, in the figure 60 mm. The fins on this single heat sink plate also have a mutual equidistant spacing of 60 mm. This means that base portions in between two adjacent fins, i.e. the bridge parts 14, have a size (width) in the direction perpendicular to the first edge of 10 mm.

Figure 2B:
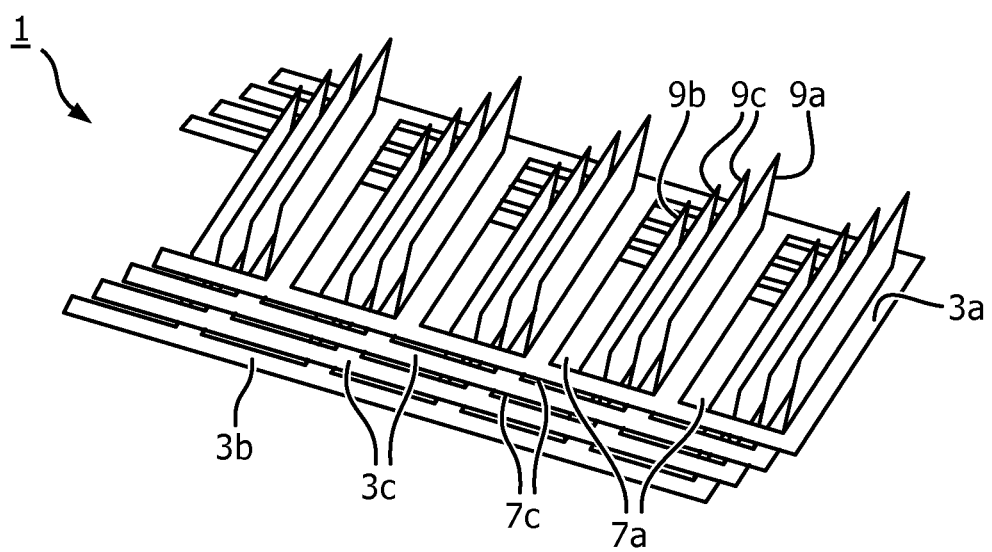
FIG. 2b shows an intermediate stage of assembling the stacked heat sink.

FIG. 2b shows an intermediate stage of assembling the stacked configuration of the first embodiment of a heat sink 1 with the protrusion of fins 9b of bottom plate 3b and fins 9c of intermediate plates 3c plate through the openings 7a in the top plate 3a and openings 7c of the intermediate plates 3c.

Figure 2C:
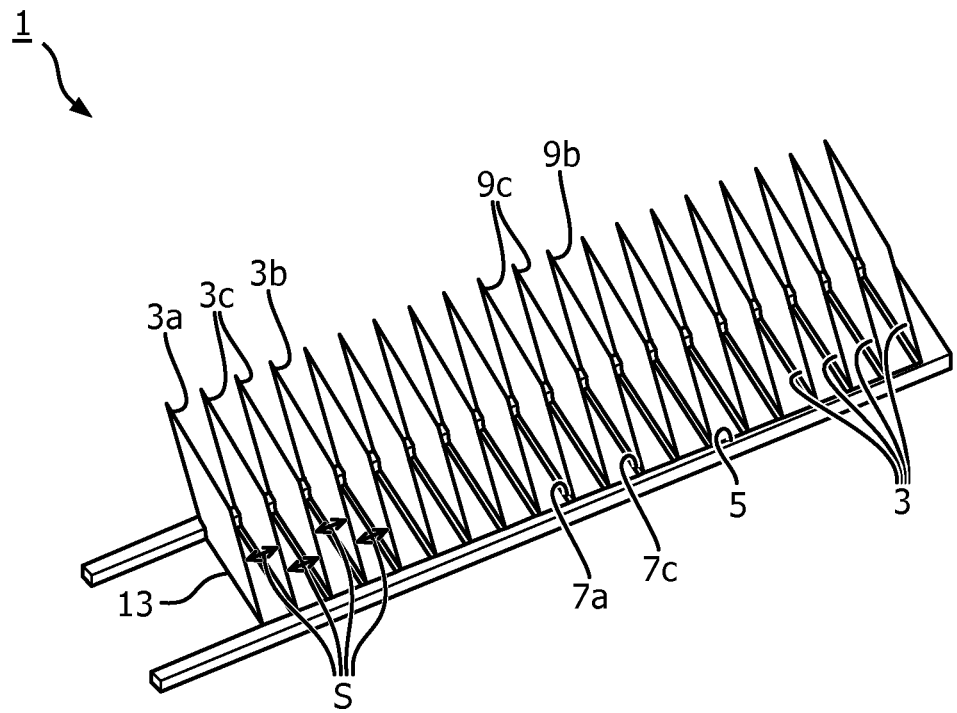

FIG. 2c shows the assembled stage of a first embodiment of a finned heat sink 1 according to the invention and comprises a stacked configuration of N heat sink plates 3 of FIG. 2a wherein N=4. The stack comprises a top plate 3a, a bottom plate 3b and two sandwiched plates 3c in between said top and bottom plate. Fins 9b,9c of the plates below the top plate all extend through openings 7a in the top plate, the fins 9b of the bottom plate extends through the openings 7c in the sandwiched plates and the openings in the top plates. In short, fins of a lower plates extend to openings of plates on top of said lower plate. Furthermore, the fins are all equidistantly spaced at a spacing S of O/N=60 mm/4=15 mm, i.e., in a direction transverse to the first edges 13 and all extend essentially in the same direction from the base part 5 and at the same side of the top plate.

Figure 3:
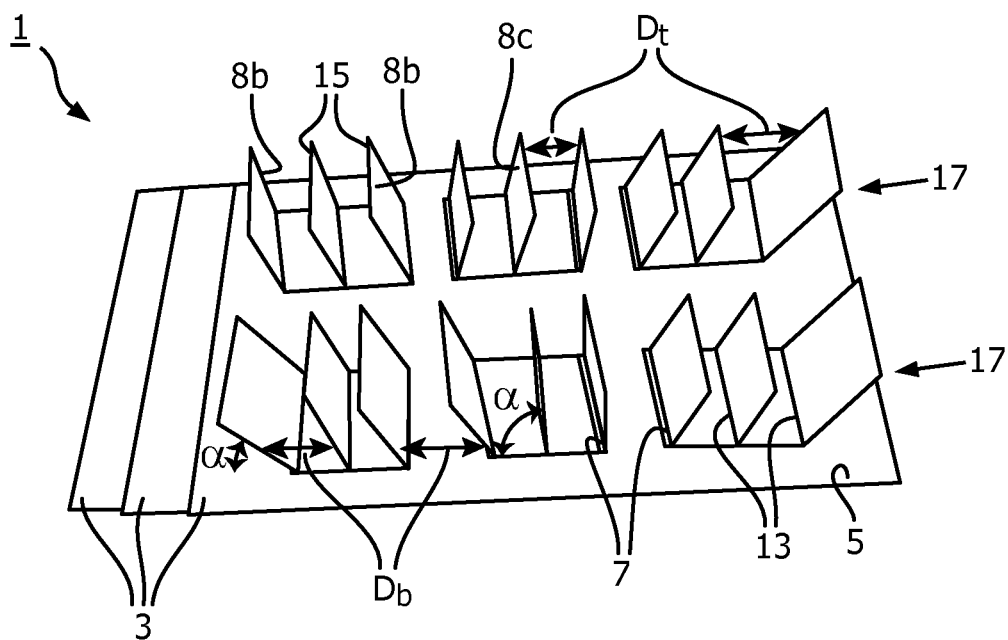
FIG. 3 shows a second embodiment of the finned heat sink according to the invention.

FIG. 3 shows a second embodiment of the finned heat sink 1 according to the invention comprising stack of three heat sink plates 3. Each heats sink plate comprises openings 7 and fins 9 which each are arranged in two parallel rows 17. The first edges 13 of the fins, which also form the base of the fins, are arranged equidistantly at distance Db. However, the angle α at which the fins extend from the base part 5 gradually decreases from α=90° for central fins 8c, via intermediate fins 8b to most outer fins 8a which extend at α≈60°. In the embodiment of FIG. 3 a distance Dt between top edges 15 of the fins is larger on average than the distance Db of the fins at their first edge 13, i.e. the distance between the fins widens from first edges towards top edges of the fins. The heat sink in the figure is made of high a temperature resistant and thermal conductive plastic or polymer, for example Coolpoly®, polyphenylenesulfide (PPS), or Vespel-SP22® comprising 40% graphite.

Figure 4A:
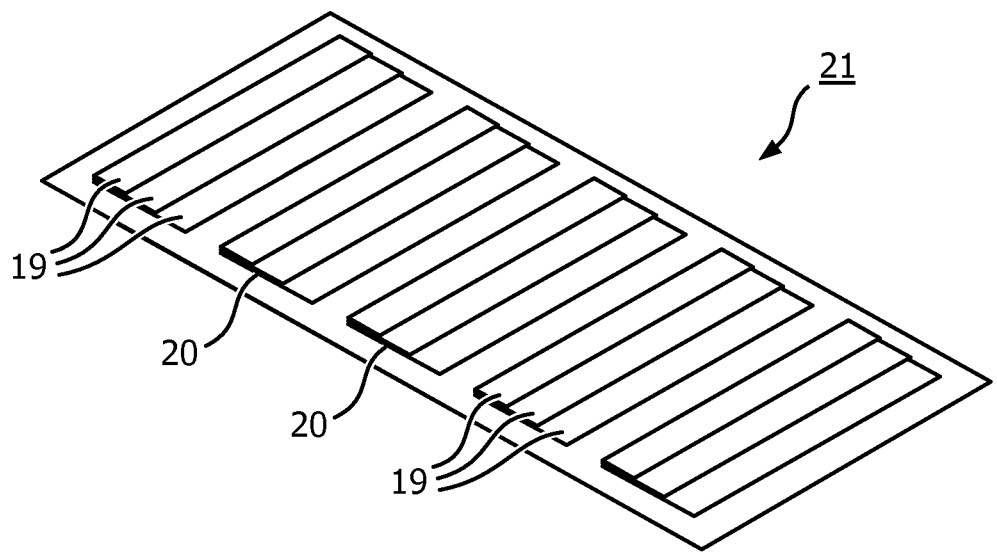
FIG. 4a shows a base with a stepped profile of a heatsink according to the invention.
Figure 4B:
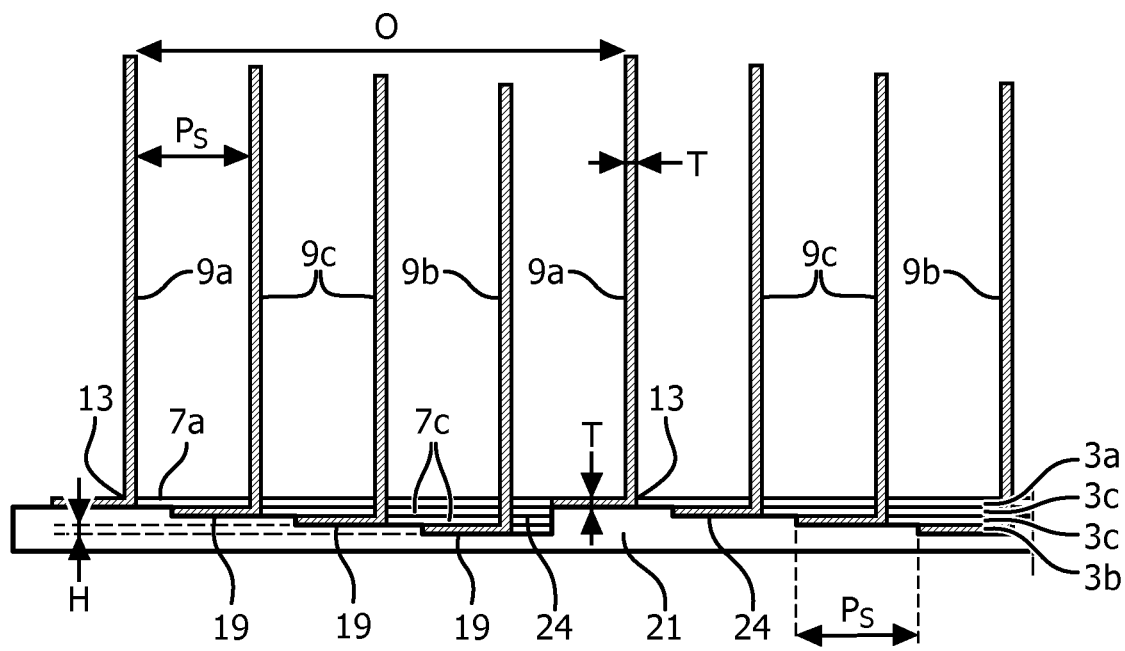

FIG. 4a shows a heatsink base 21 with a stepped profile 20. The stepped profile comprises profile steps 19. FIG. 4b shows a cross-sectional view of a third embodiment of the finned heat sink 1 according to the invention and comprises a stacked configuration of N heat sink plates 3a-c wherein N=4. The stack comprises a top plate 3a, a bottom plate 3b and two sandwiched plates 3c in between said top and bottom plate. Fins 9b,9c of plates below the top plate 9a all extend to all openings 7a,7c of plates on top of said lower plates. The heat sink base 21 of the heat sink comprises the profile step 19 with a profile size Ps according to the relation Ps=O/N, wherein O is the distance between two adjacent first edges 13 in the base part of the top heat sink plate 3a transverse to the first edge, and Ps is measured along the plane of the base part of the top heat sink plate in a direction transverse to the first edge. The heat sink plate has a thickness T and so have the base part 5 and the fins 9. Each profile step 19 has a height H essentially equal to said thickness T. Between the heat sink base and the heat sink plates a heat conductive filler material 24 is provided to reduce the through plane resistance Rth.

Figure 5:
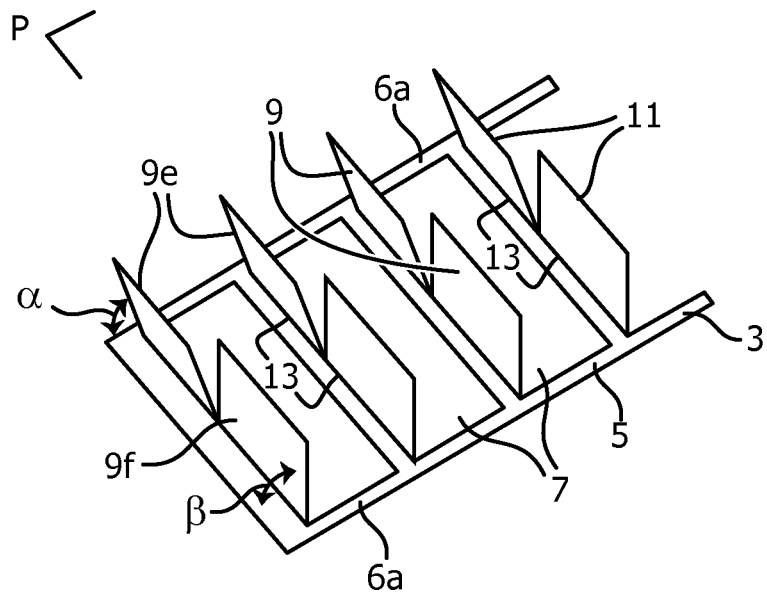
FIG. 5 shows a perspective view of a fourth embodiment of the finned heat sink according to the invention.

FIG. 5 shows a perspective view of an embodiment of a single heat sink plate 3 to be used in a fourth embodiment of a finned heat sink according to the invention. The single heat sink plate has a base part 5 with four openings 7 and eight fins 9. Each opening 7 is bordered a.o. by side strips 6a. From each opening two rectangular, neighboring fins 9e,9f have been punched along three sides of a perimeter 11 of each fin. The neighboring two fins together have the same size as the size of the opening. A first edge 13 of the perimeter 11 remains un-punched and each fin is bend over said first edge out of plane P of the base part to extend at a specific angle α or β to said plane. The fins 9e extend at an angle α with the base part 5, with α≈75° and the fins 9f extend at an angle β with the base part, with β≈105°.

Figure 6A:
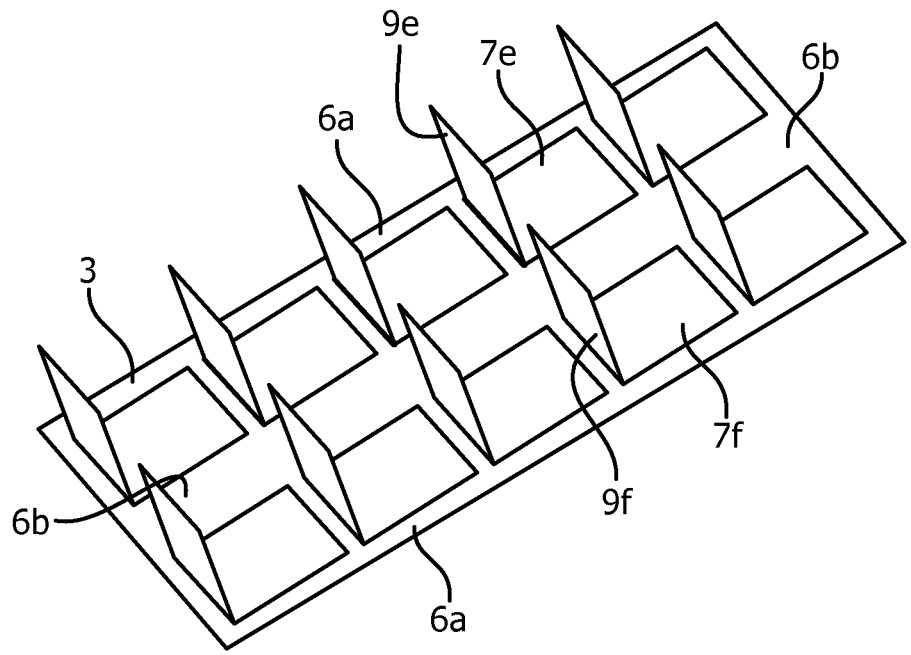
FIG. 6a shows an embodiment of a heat sink plate with multiple rows of fins.

FIG. 6a shows a single heat sink plate 3 with multiple parallel rows of fins 9 and openings 7, said heat sink plate can be used as an elementary heat sink plate as will be discussed below. Two neighboring fins 9e,9f each have a respective opening 7e,7f. Each opening has a perimeter 11 bordered a.o. by longitudinal side strip 6a and a central strip 6b. Said openings 7e,7f are separated by the longitudinal central strip 6b.

Figure 6B:
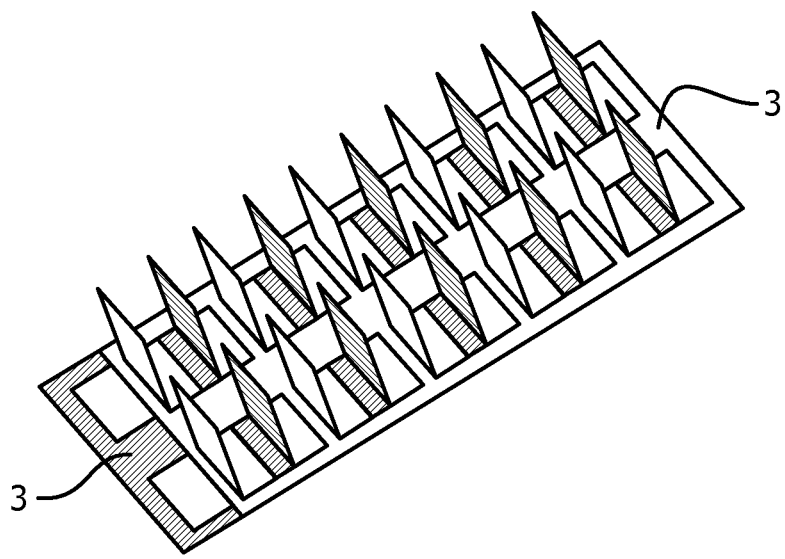
Figure 6C:
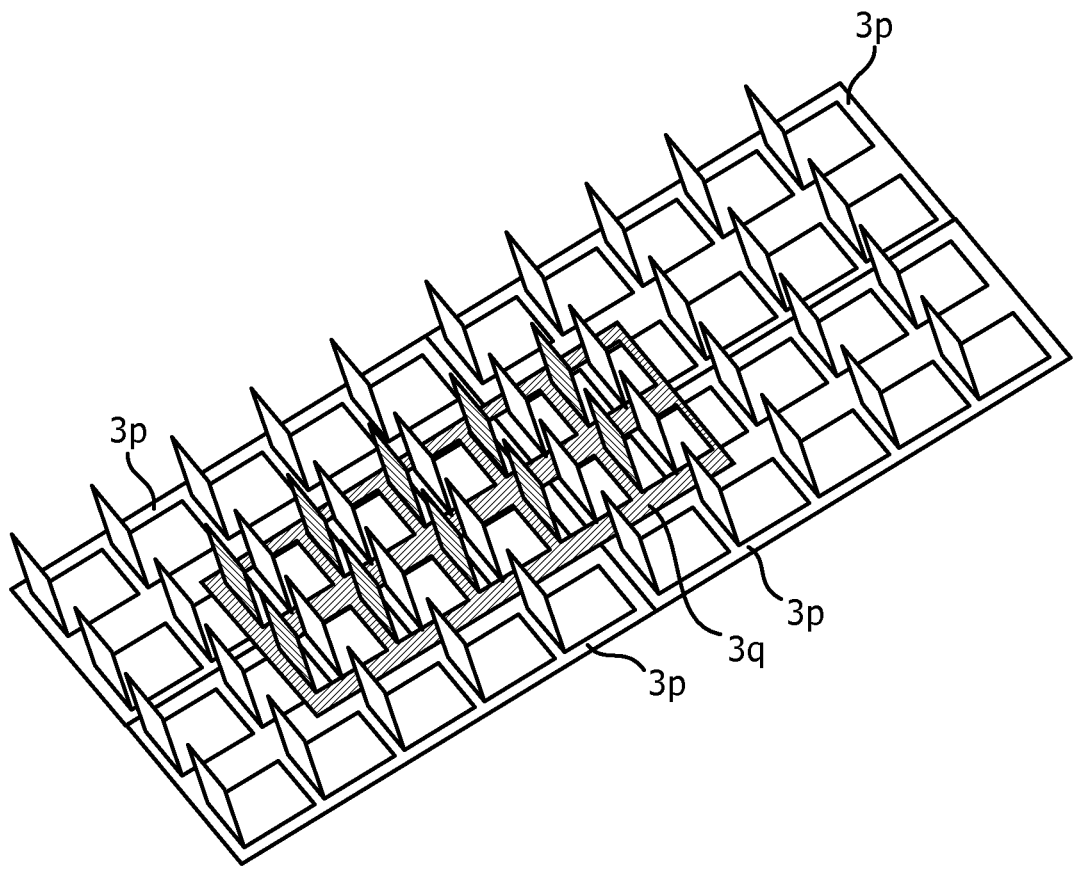

FIG. 6b shows a stack of two heat sink plates 3 of FIG. 6a. In FIG. 6b the two plates are stacked such that they overlap about maximally, i.e. they have practically "full" overlap. In FIG. 6c tiling and another stacking of the heat sink plates 3 of FIG. 6a is shown. It is shown that four adjoining heat sink plates 3p are positioned or tiled in a two by two matrix arrangement mutually abutting each other. A fifth heat sink plate 3q is stacked on top of said four heat sink plates 3p and made to partially overlap with each of said four heats sink plates. The overlapping is shown only for one heat sink plate 3q, but as can be easily envisaged, more heat sink plates can be used in this way to create an even larger combined heat sink plate. Thus a combined heat sink can be created by a number of elementary heat sink plates, said combined heat sink plate has a larger size than the size of an elementary heat sink plate.

Figure 7:
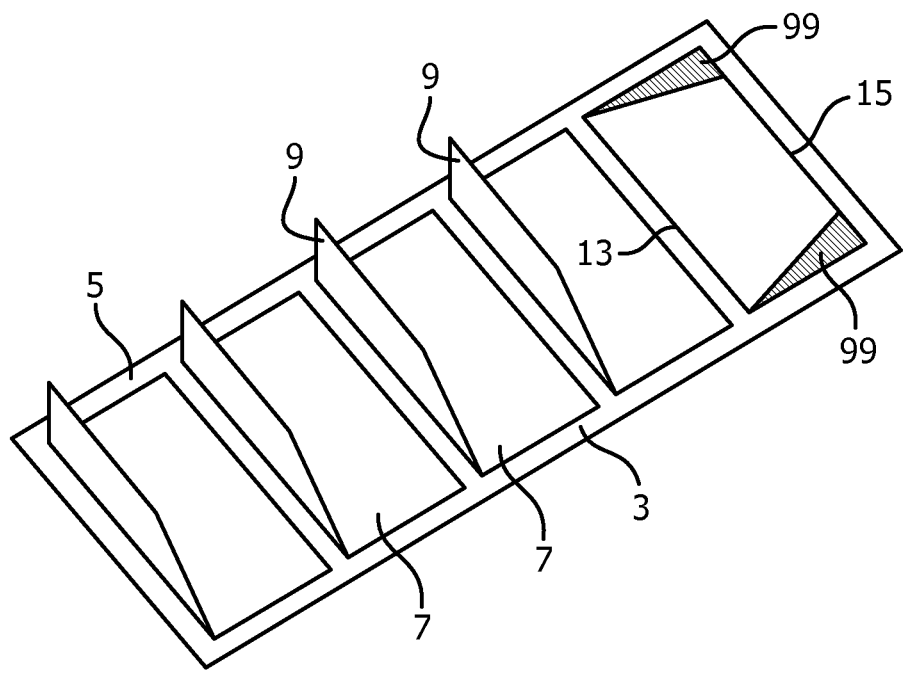
FIG. 7 shows an embodiment of a heat sink plate with a fin smaller than the opening.

FIG. 7 shows another embodiment of a heat sink plate 3 where the fin 9 is smaller than the opening 7. In this specific embodiment the fin is tapering from first edge 13 to top edge 15 rendering some waste parts 99 but also rendering the advantages that the fins can more easily bent out of plane P of the base part 5 of the heat sink plate as well as that stacking of multiple heats sink plates is facilitated.

Figure 8:
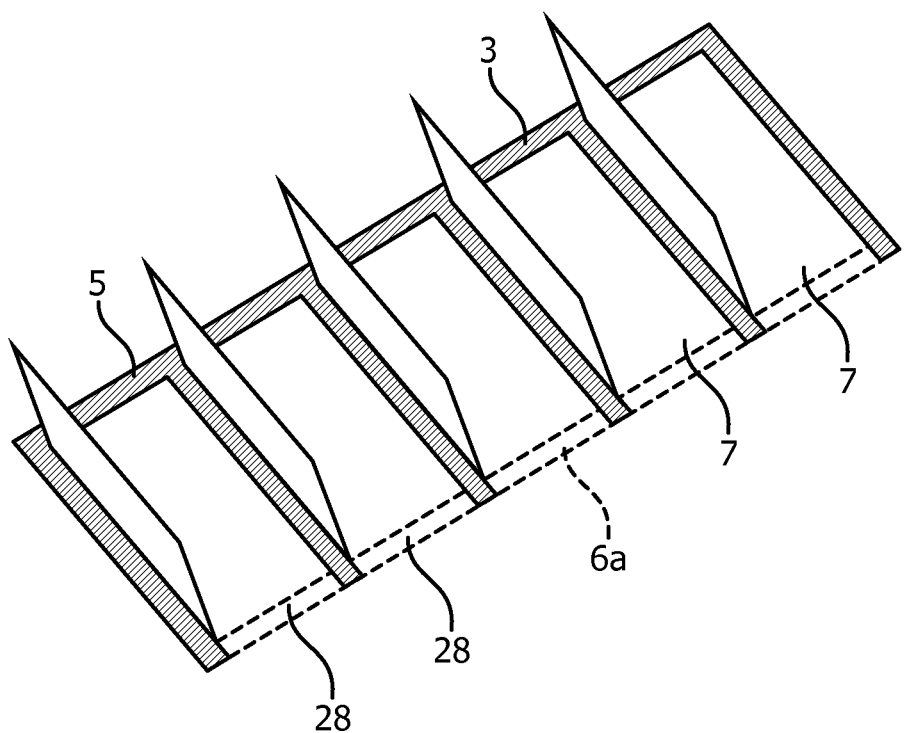
FIG. 8 shows an embodiment of a heat sink plate with one longitudinal side strip removed.

FIG. 8 shows an embodiment of a heat sink plate 3 according to the invention in which one longitudinal side strip 6a, indicated in phantom, of the base part 5 of the heat sink plate is removed. Thus, openings 7 with an open side 28 are obtained and a sideways assembly and stacking of multiple heat sink plates is enabled.

Figure 9A:
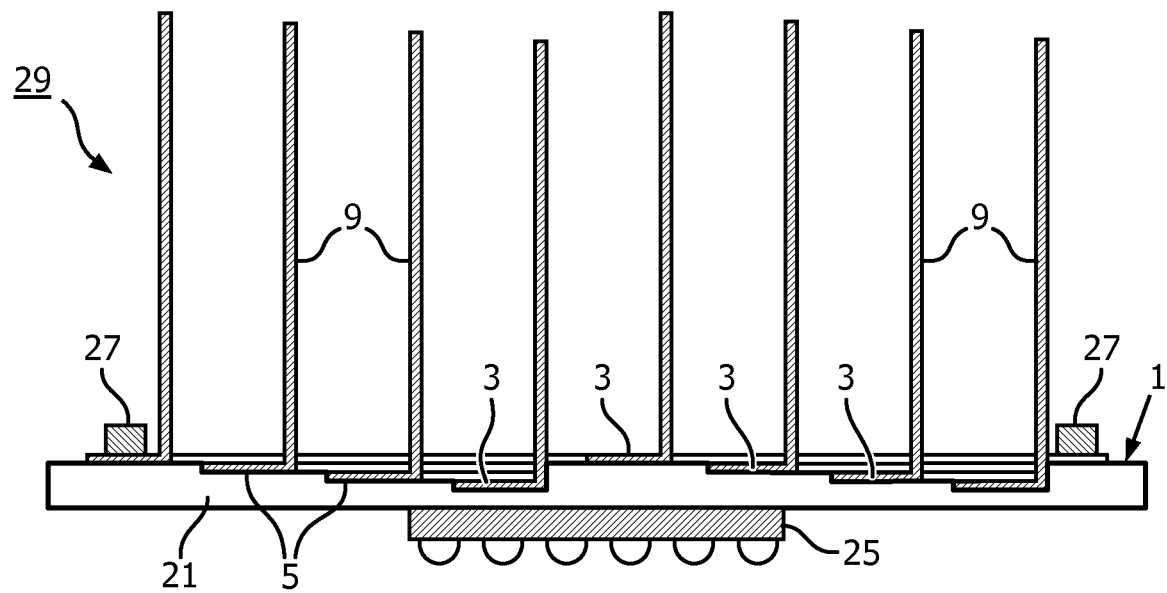
FIG. 9a shows an embodiment in a lighting device application with fins to the opposite side of a heat sink with respect to a light source.

FIG. 9a shows an embodiment of the heat sink 1 according to the invention mounted and applied in a lighting device 29. In the lighting device the fins 9 of the heat sink are located at an opposite side of the heat sink base 21 with respect to a light source 25. In FIG. 9a the lighting device is a LED lamp according to the invention comprising the LED light source 25 mounted on the heat sink base. A similar construction as shown in FIG. 9a can be applied in a LED luminaire. The finned heat sink plates 3 are firmly mutually attached and to base 21 via screws 27 resulting in an increased (thermal) contact between the heatsink base 21 and base parts 5 of adjacent stacked heat sink plates 3, thus further reducing Rth.

Figure 9B:
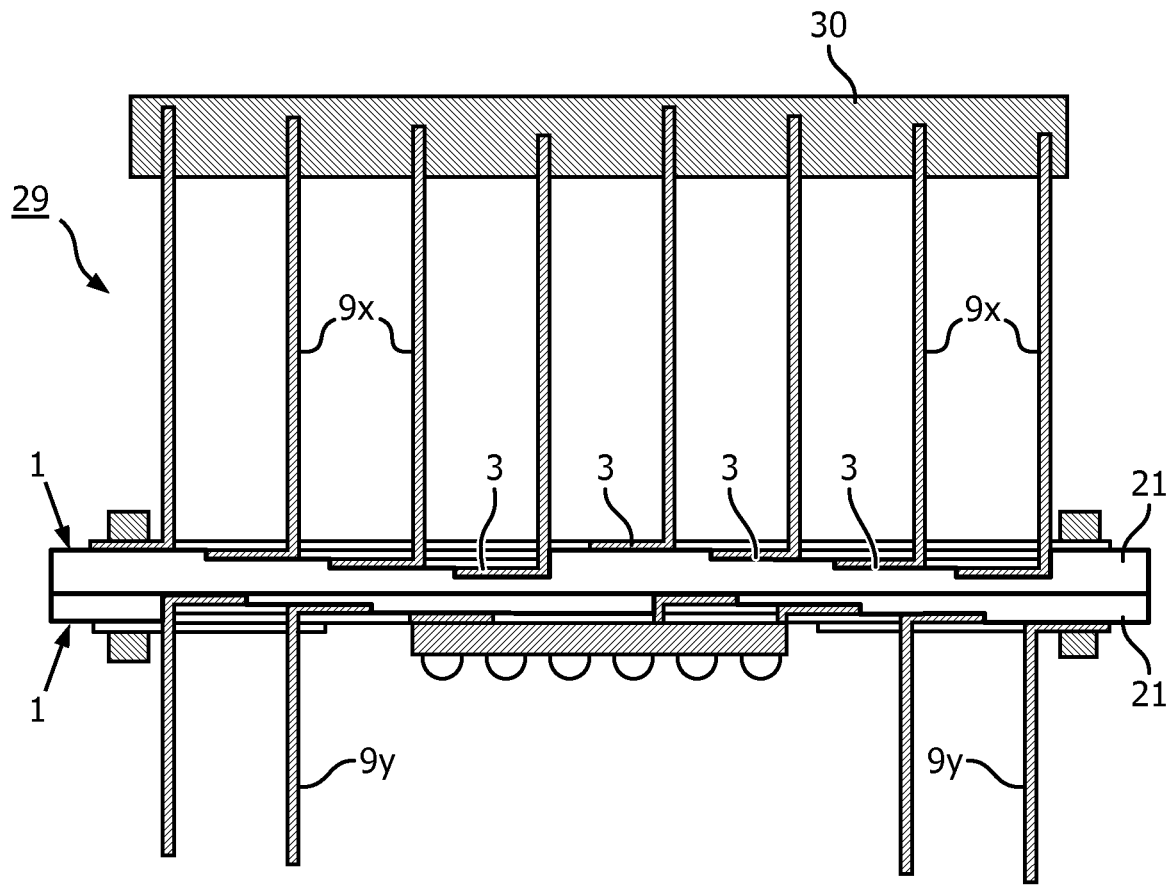
FIG. 9b shows an embodiment with fins and light source both at the same side of the heat sink and with fins at the side opposite of the heat sink with respect to the light source.

FIG. 9b shows a similar embodiment of a LED lamp 29, made out of copper metal laminated graphite sheet, and with an alternative configuration of heat sinks 1, i.e. the heat sink has additional heat sink plates 3 on the side of the LED light source, creating a finned stacked heatsink with fins 9y in extending away from the heatsink base 21 at the side on which the LED light source is mounted, and in an opposite (perpendicular) direction thereto, fins 9x that extend away from the LED light source at a side of the heat sink base facing away from the LED light source. Furthermore, the eight fins 9x at a side of the heats sink base facing away from the light source are mutually mechanically joined through a slotted plate 30, for example an aluminum plate, increasing the mechanical stability of the fin package.

The invention claimed is:

1. A finned heat sink comprising:
   a plurality of N heat sink plates including at least a bottom plate and a top plate, each of the heat sink plates including at least two heat dissipating fins, wherein a first edge of each heat dissipating fin is bent out of a plane of the respective heat sink plate, each heat sink plate further includes a base part with an opening, wherein the base part of the top plate is on top of the base part of the bottom plate and wherein a heat dissipating fin of the bottom plate is bent and extends through the opening in the top plate,
   a heatsink base wherein the plurality of N heat sink plates are mounted, wherein each heat sink plate has a thickness T and the heatsink base comprises a profile step with a profile size Ps according to the relation $Ps=O/N$, wherein O is the distance between two adjacent first edges of the at least two heat dissipating fins in the base part of the top heat sink plate transverse to the first edge, and Ps is measured along the plane P of the base part of the top heat sink plate in a direction transverse to the first edge, each step having a height H essentially equal to said thickness T.

2. The finned heat sink as claimed in claim 1, wherein for each heat sink plate, the heat dissipating fins have a perimeter comprising a first edge part, said heat dissipating fins being cut out from the base part over said perimeter except for said first edge part.

3. The finned heat sink as claimed in claim 1, wherein the plurality of N heat sink plates comprises a sandwiched plate located in between the top and bottom plate, a fin of the sandwiched plate extends through the opening of the top plate.

4. The finned heat sink as claimed in claim 1, wherein the heat dissipating fins have a surface area essentially of a size equal to a size of the opening bordered by the first edge of said respective fin.

5. The finned heat sink as claimed in claim 1, wherein the heat dissipating fins of the heat sink plates are spaced apart by a spacing S according to the relation $S=O/N$, wherein O is the distance between two adjacent first edges of the at least two heat dissipating fins in the base part of the top heat sink plate transverse to the first edge, and S is measured along the plane of the base part of the top heat sink plate in a direction transverse to the first edge.

6. The finned heat sink as claimed in claim 1, wherein the heat sink plates abut each other with the base parts and are mutually fixed.

7. The finned heat sink as claimed in claim 1, wherein a heat conducting filler material is provided in between the heatsink base and the base parts of adjacent heat sink plates.

8. The finned heat sink as claimed in claim 1, wherein N is in the range of 2 to 10.

9. The finned heat sink as claimed in claim 1, wherein the openings formed by the bending of material out of the plane of the respective heat sink plate to form a single fin of the heat dissipating fins, is larger than the respective single fin.

10. The finned heat sink as claimed in claim 1, wherein a single opening is formed by bending material out of plane of the heat sink plate to form a plurality of fins of the heat dissipating fins.

11. A lighting device comprising a finned heat sink according to claim 1.

12. Lighting device as claimed in claim 11, wherein the lighting device is a LED lamp.

13. The finned heat sink as claimed in claim 1, wherein N is in the range of 3 to 6.

* * * * *